(12) United States Patent
Suhir

(10) Patent No.: US 7,477,527 B2
(45) Date of Patent: Jan. 13, 2009

(54) APPARATUS FOR ATTACHING A COOLING STRUCTURE TO AN INTEGRATED CIRCUIT

(75) Inventor: Ephraim Suhir, Los Altos, CA (US)

(73) Assignee: Nanoconduction, Inc., Menlo Park, CA (US)

( * ) Notice: Subject to any disclaimer, the term of this patent is extended or adjusted under 35 U.S.C. 154(b) by 478 days.

(21) Appl. No.: 11/386,254

(22) Filed: Mar. 21, 2006

(65) Prior Publication Data
US 2006/0238990 A1     Oct. 26, 2006

Related U.S. Application Data

(60) Provisional application No. 60/663,225, filed on Mar. 21, 2005.

(51) Int. Cl.
*H05K 7/12*     (2006.01)
(52) U.S. Cl. .................. 361/807; 361/787; 361/723; 361/719; 257/718; 257/719; 257/713
(58) Field of Classification Search ......... 361/807–810, 361/760, 723, 715, 709, 704, 722, 717, 787; 257/706, 707, 712, 713, 718, 719, 726
See application file for complete search history.

(56) References Cited

U.S. PATENT DOCUMENTS

| | | | |
|---|---|---|---|
| 4,466,618 A | | 8/1984 | Angelini |
| 4,611,869 A | * | 9/1986 | Bonnefoy .................. 439/373 |
| 4,932,052 A | | 6/1990 | Lo |
| 5,060,543 A | | 10/1991 | Warheit |
| 5,217,094 A | | 6/1993 | Walter et al. |
| 5,713,690 A | | 2/1998 | Corbin, Jr. et al. |
| 5,808,236 A | | 9/1998 | Brezina et al. |
| 5,818,700 A | | 10/1998 | Purinton |
| 5,837,081 A | | 11/1998 | Ting |

(Continued)

FOREIGN PATENT DOCUMENTS

EP     1329953     8/2003

(Continued)

OTHER PUBLICATIONS

Iijima, et al., "Single-shell carbon nanotubes of 1-nm diameter", Nature 363, 603 (1993).

(Continued)

*Primary Examiner*—Tuan T Dinh
*Assistant Examiner*—Dameon E Levi
(74) *Attorney, Agent, or Firm*—Williams, Morgan & Amerson, P.C.

(57) ABSTRACT

A method and apparatus is provided for attaching a cooling structure to the surface of an integrated circuit (IC). The attachment of the cooling structure, for example a heat sink, to the IC requires that certain pressure is applied, usually by connecting the cooling structure to a Printed Circuit Board (PCB). However, excess pressure may damage the ball grid array (BGA) that connects the IC to the PCB. Attachment of a cooling structure to the IC package substrate is provided without support from the PCB. In one embodiment, shock absorbers are also attached to the cooling structure and the PCB to prevent undesirable vibration of the heat sink mass from affecting the IC.

23 Claims, 4 Drawing Sheets

U.S. PATENT DOCUMENTS

| | | |
|---|---|---|
| 5,932,925 A | 8/1999 | McIntyre |
| 5,965,267 A | 10/1999 | Nolan |
| 5,990,552 A | 11/1999 | Xie et al. |
| 6,015,081 A * | 1/2000 | Okabayashi et al. ... 228/180.22 |
| 6,156,256 A | 12/2000 | Kennel |
| 6,180,874 B1 | 1/2001 | Brezina et al. |
| 6,231,744 B1 | 5/2001 | Ying |
| 6,232,706 B1 | 5/2001 | Dai |
| 6,340,822 B1 | 1/2002 | Brown |
| 6,359,288 B1 | 3/2002 | Ying |
| 6,361,861 B2 | 3/2002 | Gao |
| 6,373,703 B2 | 4/2002 | Johnson et al. |
| 6,383,923 B1 | 5/2002 | Brown |
| 6,386,890 B1 * | 5/2002 | Bhatt et al. ............... 439/67 |
| 6,392,887 B1 * | 5/2002 | Day et al. ............... 361/704 |
| 6,395,991 B1 | 5/2002 | Dockerty et al. |
| 6,407,922 B1 | 6/2002 | Eckblad |
| 6,417,563 B1 | 7/2002 | Halderman et al. |
| 6,432,740 B1 | 8/2002 | Chen |
| 6,449,155 B1 | 9/2002 | Colbert et al. |
| 6,504,292 B1 | 1/2003 | Choi |
| 6,591,658 B1 | 7/2003 | Yedur et al. |
| 6,618,251 B2 | 9/2003 | Ishimine |
| 6,713,151 B1 | 3/2004 | Dean |
| 6,724,906 B2 | 4/2004 | Naksen et al. |
| 6,756,026 B2 | 6/2004 | Colbert |
| 6,800,886 B2 | 10/2004 | Awano |
| 6,821,415 B2 | 11/2004 | Sharb |
| RE38,677 E | 12/2004 | Blomquist |
| 6,853,068 B1 | 2/2005 | Djekic |
| 6,855,376 B2 | 2/2005 | Hwang |
| 6,856,016 B2 | 2/2005 | Searls |
| 6,856,511 B1 | 2/2005 | Viernes et al. |
| 6,859,367 B2 | 2/2005 | Davison |
| 6,862,962 B1 | 3/2005 | Delbrugge et al. |
| 6,864,571 B2 | 3/2005 | Arik |
| 6,880,799 B2 | 4/2005 | Mrozek |
| 6,891,724 B2 | 5/2005 | De Lorenzo |
| 6,892,652 B2 | 5/2005 | Jalbert et al. |
| 6,900,580 B2 | 5/2005 | Dai |
| 6,910,666 B2 | 6/2005 | Burr |
| 6,921,462 B2 | 7/2005 | Montgomery |
| 6,924,335 B2 | 8/2005 | Fan |
| 6,930,884 B2 * | 8/2005 | Cromwell et al. ........... 361/710 |
| 6,955,800 B2 | 10/2005 | Resasco et al. |
| 6,962,823 B2 | 11/2005 | Empedocles |
| 6,965,513 B2 | 11/2005 | Montgomery |
| 6,989,325 B2 | 1/2006 | Uang |
| 6,998,358 B2 | 2/2006 | French et al. |
| 7,008,604 B2 | 3/2006 | Smalley |
| 7,011,771 B2 | 3/2006 | Gao |
| 7,029,646 B2 | 4/2006 | Margrave |
| 7,033,647 B2 | 4/2006 | Tang et al. |
| 7,052,666 B2 | 5/2006 | Colbert |
| 7,096,580 B2 * | 8/2006 | Gonzalez et al. .............. 29/832 |
| 7,289,335 B2 * | 10/2007 | Callahan et al. ............. 361/803 |
| 7,293,994 B2 * | 11/2007 | Brodsky et al. ............... 439/66 |
| 7,323,358 B1 * | 1/2008 | Cromwell ................... 438/106 |
| 2002/0090501 A1 | 7/2002 | Tobita |
| 2002/0100581 A1 | 8/2002 | Knowles |
| 2002/0130407 A1 | 9/2002 | Dahl |
| 2002/0145194 A1 | 10/2002 | O'Conner |
| 2002/0163079 A1 | 11/2002 | Awano |
| 2003/0111333 A1 | 6/2003 | Montgomery |
| 2003/0117770 A1 | 6/2003 | Montgomery |
| 2003/0231471 A1 | 12/2003 | De Lorenzo |
| 2004/0005736 A1 | 1/2004 | Searls |
| 2004/0013598 A1 | 1/2004 | McElrath |
| 2004/0053053 A1 | 3/2004 | Jiang |
| 2004/0101468 A1 | 5/2004 | Liu |
| 2004/0136161 A1 | 7/2004 | Miyamura et al. |
| 2004/0146560 A1 | 7/2004 | Whiteford |
| 2004/0150100 A1 | 8/2004 | Dubin |
| 2004/0152240 A1 | 8/2004 | Dangelo |
| 2004/0182600 A1 | 9/2004 | Kawabata |
| 2004/0184241 A1 | 9/2004 | De Lorenzo |
| 2004/0191158 A1 | 9/2004 | Liu et al. |
| 2004/0218362 A1 | 11/2004 | Amaro |
| 2004/0261978 A1 | 12/2004 | Zhan |
| 2004/0261987 A1 | 12/2004 | Zhang |
| 2004/0265489 A1 | 12/2004 | Dubin |
| 2004/0266063 A1 | 12/2004 | Montgomery |
| 2004/0266065 A1 | 12/2004 | Zhang |
| 2005/0006754 A1 | 1/2005 | Arik |
| 2005/0037204 A1 | 2/2005 | Osiander |
| 2005/0046017 A1 | 3/2005 | Dangelo |
| 2005/0061496 A1 | 3/2005 | Matabayas |
| 2005/0067693 A1 | 3/2005 | Nihei |
| 2005/0092464 A1 | 5/2005 | Leu |
| 2005/0116336 A1 | 6/2005 | Chopra |
| 2005/0136248 A1 | 6/2005 | Leu |
| 2005/0139642 A1 | 6/2005 | Koning |
| 2005/0139991 A1 | 6/2005 | White |
| 2005/0150887 A1 | 7/2005 | Taya |
| 2005/0167647 A1 | 8/2005 | Huang |
| 2005/0224220 A1 | 10/2005 | Li |
| 2005/0238810 A1 | 10/2005 | Scaringe |
| 2005/0260412 A1 | 11/2005 | Gardner |
| 2005/0269726 A1 | 12/2005 | Matabayas, Jr. |

FOREIGN PATENT DOCUMENTS

| | | |
|---|---|---|
| WO | WO 03/054958 | 7/2003 |
| WO | WO 03/072679 | 9/2003 |
| WO | WO 03/107419 | 12/2003 |

OTHER PUBLICATIONS

Baughman, et al.; "Carbon-Nanotubes—the Route Toward Applications", W A, Science 297, 787 (2002).

Wong, et al.; "Nanobeam Mechanics: Elasticity, Strength, and Toughness of Nanorods and Nanotubes", Science 277, 1971 (1997).

Yu, et al.; Tensile Loading of Ropes of Single Wall Carbon Nanotubes and their Mechanical Properties', Phys. Rev. Lett. 84 5552 (2000).

Odom, et al.;"Atomic structure and electronic properties of single-walled carbon nanotubes", Nature 391, 62 (1998).

Wildoer, et al.;"Electronic structure of Atomically resolved carbon nanotubes", Nature, 391, 59(1998).

Li, J. et al. "Bottom Up Approach for Carbon Nanotube Interconnects." Applied Phys. Letters, American Institute of Physics, Apr. 18, 2003, pp. 2491-2493, vol. 82, No. 15.

Baughman, et al.;"Carbon Nanotube Actuators", Science 284, 1340 (1999).

Star. Et al; "Nano Optoelectronic Memory Devices", Nano Lett. 4, 1587 (2004).

Lee, et al.;"Bandgap Modulation of Carbon Nanotubes by Encapsulated Metallofullerenes", pp. 1005-1008.

Collins, et al.; "Engineering Carbon Nanotubes and Nanotube Circuits Using Electrical Breakdown", Science 292, 706 (2001).

Bachtold, et al.; "Logic Circuits with Carbon Nanotube Transistors", Science 294, 1317 (2001).

Koehne, et al.;"Ultrasensitive label-free DNA analysis using an electronic chip based on carbon nanotube nanoelectrode arrays", Nanotechnology, 14 , 1239 (2003).

Kong, et al.; "Nanotube Molecular Wires as Chemical Sensors", Science 287, 622 (2000).

Li, et al.;"Carbon Nanotube Sensors for Gas and Organic Vapor Detection", Nano Lett. 3, 929 (2003).

Novak, et al.;"Nerve agent detection using networks of single-walled carbon nanotubes", Appl. Phys. Lett. 83, 4026 (2003).

Ruoff, et al.; "Mechanical and Thermal Properties of Carbon Nanotubes", Carbon 33, 925 (1995).

Fujii, et al.;"Measuring the Thermal Conductivity of a Single Carbon Nanotube", Phys. Rev. Lett. 95, 065502 (2005).

Kim, et al.; "Thermal Transport Measurements of Individual Multiwalled Nanotubes", Phys. Rev. Lett.87 215502 (2001).

Pop, et al.;"Thermal Conductance of an Individual Single-Wall Carbon Nanotube above Room Temperature", Nano Lett. 6, 96 (2006).

Xu, et al.; "Enhancement of Thermal Interface Materials with Carbon Nanotube Arrays," International Journal of Heat and Mass Transfer, vol. 49, pp. 1658-1666, (2006).

Yu, et al.; "Thermal Contact Resistance and Thermal Conductivity of a Carbon Nanofiber", J. Heat. Tran. 2006, 128, 234.

Wang, et al.; "Photo-Acoustic Measurement of Thermal Conductivity of Thin Films and Bulk Materials", ASME, J. Heat Transfer, 123, 138 (2001).

Dresselhaus, et al.;"Raman spectroscopy on one isolated carbon nanotube", Physica B. 232, 15 (2002).

Dresselhaus, et al.; "Phonons in carbon nanotubes", Adv. Phys. 49, 705 (2000).

Markutsya, et al.; "Freely Suspended Layer-by-layer Nanomembranes: Testing Micrormechanical Properties", pp. 771-780, (2005).

Brown, et al.; "Anti-Stokes Raman spectra of single-walled carbon nanotubes", Phys. Rev. B. 61, 5137 (2000).

Jorio, et al.; "Structural (n,m) Determination of Isolated Single-Wall Carbon Nanotubes by Resonant Raman Scattering", Phys. Rev. Lett. 86, 1118 (2001).

Sullivan, et al.;"An Experimental and Theoretical Study of Transient Negative Ions in Mg, Zn, Cd, and Hg", pp. 159.1-159.26, (2003).

Popov, et al.; "Carbon nanotubes: properties and application", Mat. Sci. Eng. R, 43, 61, (2004).

Bachtold, et al.; "Contacting carbon nanotubes selectively with low-ohmic contacts for four-probe electric measurements", Appl. Phys. Lett. 73, 274, (1998).

Zhang, et al.; "Heterostructures of Single-Walled Carbon Nanotubes and Carbide Nanorods", Science, 285, 1719 (1999).

Lee, et al.; "Formation of low-resistance ohmic contacts between carbon nanotube and metal electrodes by a rapid thermal annealing method", J. Phys. D. Appl. Phys, 33, 1953 (2000).

Terekhov, et al.; "Laser heating method for estimation of carbon annotube purity", Appl. Phys. A, 74, 393 (2002).

Terekhov, et al.; "Calibration of Raman-Based Method for Estimation of Carbon Nanotube Purity", AIP Proc. 685, 116 (2003).

E. Suhir, "1Bimaterial assembly with a low modulus bonding layer at the ends", Journal of Applied Physics, 93, 3657, (2003).

Treacy, et al.; "Exceptionally high Young's modulus observed for individual carbon nanotubes", Lett Nature, 381, 678, (1996).

Yao, et al.;"Young's Modulus of Single Walled Carbon Nanotubes", J. Appl. Phys., 84(4):1939-1943, (1998).

Hernandez, et al.; "Elastic Properties of c and bxcynz Composite Nanotubes", Phys. Rev. Lett., 80(20):4502-4505, (1998).

Krishnan, et al.; "Young's Modulus of Single Walled Nanotubes", Phys. Rev. B. 58(20):14013-14019, (1998).

Poncharal, et al.; "Electrostatic Deflections and Electromechanical Resonances of Carbon Nanotubes" Science, 283, 1513 (1999).

Gaillard, et al.; 2005, "Mechanical properties of chemical vapor deposition-grown multiwalled carbon nanotubes", Applied Physics Letters, vol. 86, No. 23 (2005).

Wei, et al.; 2004, "Nanomechanics of carbon nanofibers: structural and elastic properties", Applied Physics Letters, vol. 85, No. 12, pp. 2208-2210 (2004).

Salvetat, et al.; "Elastic Modulus of Ordered and Disordered Multi-Walled Carbon Nanotubes", Adv. Mater. 11(2):161-165, (1999).

Cao, et al.; "Super compressible foam like carbon nanotube films", Science, 310, 1307 (2005).

Xin, et al.; "Strain Energy and Young's Modulus of Single-Wall Carbon Nanotubes Calculated From Electronic Energy-Band Theory", Phys. Rev., B, 62(20):13692-13696, (2000).

Ru, C.Q., "Effective Bending Stiffness of Carbon Nanotubes", Phys. Rev. B. 62(15):9973-9976, (2000).

Yu et. al., "Strength and Breaking Mechanism of Multiwalled Carbon Nanotubes Under Tensile Load", Science, 287, 637 (2000).

Kuzumaki et. al., "Dynamic measurement of electrical conductivity of carbon nanotubes during mechanical deformation by nanoprobe manipulation in transmission electron microscopy", Appl. Phys. Lett. 85, 1250 (2004).

Nishio et. al.; "Buckling Test under Axial Compression for Multiwall Carbon Nanotubes", Jpn. J. Appl. Phys. 44, L1097 (2005).

Govindjee, et al.; "On the Use of Continuum Mechanics to Estimate the Properties of Nanotubes", Solid State Comm., 110(4):227-230, (1999).

Harik, V.M.; "Ranges of Applicability for the Continuum Beam Model in the Mechanics of Carbon Nano-Tubes and Nano-Rods", Solid State Comm, 120(331-335), (2001).

Lourie, et al.; "Buckling and Collapse of Embedded Carbon Nanotubes", Phys. Rev. Letters, 81(8): 1638-1641, (1988).

Falvo, et al; "Bending and Buckling of Carbon Nanotubes Under Large Strain", Nature, 389 (6651): 582-584, (1997).

Ru, C.Q.; "Effect of van der Waals Forces on Axial Buckling of a Double-Walled Carbon Nanotube", J.Appl.Phys., 87(10):7227-7231, (2000).

Ru, C.Q.; "Column Buckling of Multi-Walled Carbon Nanotubes with Interlayer Radial Displacements", Phys. Rev., B, 62(24):16962-16967, (2000).

Ru, C.Q.; "Degraded Axial Buckling Strain of Multi-Walled Carbon Nanotibes due to Interlayer Slips", J. Appl. Physics, 89(6):3426-3433, (2001).

Wang, et al.;"Axially Compressed Buckling of Pressured Multiwall Carbon Nanotubes", pp. 3893-3911, (2002).

Ru, C.Q.; "Elastic Buckling of Single Walled Carbon Nanotube Ropes Under High Pressure", Phys. Rev., B. 62(15):10405-10408, (2000).

Cruden, et al.; "Reactor design considerations in the hot filament/direct current plasma synthesis of carbon nanofibers", J. Appl. Phys., 94, 4070, (2003).

Li, J. et al. "Electronic Properties of Multiwalled Carbon Nanotubes in an Embedded Vertical Array." Applied Physics Letters, vol. 18, No. I 5, Jul. 29, 2002, pp. 910-912.

Cui, et al.;"Growth of Carbon Nanofibers on Tipless Cantilevers for High Resolution Topography and Magnetic Force Imaging", Nano Lett. 4, 2157 (2004).

Chen, et al.; "Extremely Sharp carbon nanocone probes for atomic force microscopy imaging", Appl. Phys. Lett. 88, 153102 (2006).

E. Suhir, "Analysis of Interfacial Thermal Stresses in a Tri-Material Assembly", Journal of Applied Physics, 89, 3685 (2001).

Banerjee, K. et al. "3-D Heterogeneous ICs: a Technology for the Next Decade and Beyond." 5th IEEE Workshop on Signal propagation on Interconnects, Venice, Italy, May 13-15, 2001.

Berber et al. "Unusually High Thermal Conductivity of Carbon Nanotubes, Physical Review Letters." May 15, 2000, pp. 4613-4616, vol. 84, No. 20.

Cassell, a. "Direct Growth of Free-standing single-Walled Carbon Nanotubes." J. Am. Chemical society, 1999, 121, pp. 7975-7976.

Chiang, T.Y. "A New Analytical Thermal Model for Multilevel ULSI Interconnects Incorporating Via Effect." Center for Integrated Systems, Standard University.

Chiang, T.Y. "Effect of Via Separation and Low-k Dielectric Materials on the Thermal Characteristics of Cu Interconnects." IEDM 2000.

Cui, Y. et al. "Doping and Electrical Transport in Silicon Nanowires." Journal of Physical Chemistry, vol. 104, No. 22, Jun. 8, 2000, pp. 5213-5216.

de Pablo, P.J. "A Simple, Reliable Technique for Making Electrical Contact to Multiwalled Carbon Nanotubes." Applied Physics Letters, vol. 74, No. 2, Jan. 11, 1999, pp. 323-325.

Delzeit, L. et al. "Growth of Carbon Nanotubes by Thermal and Plasma Chemical Vapour Deposition Processes and Applications in Microscopy." Nanotechnology, vol. 13, May 23, 2002, pp. 280-284.

Delzeit, L. et al. "Growth of Multiwall Carbon Nanotubes in an Inductively Coupled Plasma Reactor." Journal of Applied Physics, vol. 91, No. 9, May 1, 2002, pp. 6027-6033.

Goodson, K.E. et al. "Improved Heat Sinking for Laser-Diode Arrays Using Microchannels in CBD Diamond." IEE Transactions on Compounds, Packaging, and Manufacturing Technology, Part B, Advanced Packaging, vol. 20, Issue 1, Feb. 1997, pp. 104-109.

Hone, J. et al. "Thermoelectric Power of Single-Walled Carbon Nanotubes." Physical Review Letters, vol. 80, No. 5, Feb. 2, 1998, pp. 1042-1045.

Huang, Z.P. et al. "Growth of Highly Oriented Carbon Nanotubes by Plasma-Enhanced Hot Filament Chemical Vapor Deposition." Applied Physics Letters, vol. 73, No. 26, Dec. 28, 1998, pp. 3845-3847.

International Semiconductor Road Map (ITRS-2001), Section on Interconnect, http://public/itrs.net/files/2001ITRS/interconnect.pdf.

Kim, M.J. et al. "Growth Characteristics of Carbon Nanotubes via Aluminum Nanopore Template on Si Substrate Using PECVD." Elsevier Thin Solid Films, vol. 425, 2003, pp. 312-317.

Kong, J. et al. "Synthesis of Individual Single-Walled Carbon Nanotubes on Patterned Silicon Wafers." Nature, vol. 395, Oct. 29, 1998, pp. 878-881.

Kurabayashi, K. et al. "Precision Measurement and Mapping of die-attach Termal Resistance." IEEE Transactions on Components, Packaging, and Manufacturing Technology, Part A: Advanced Packaging, vol. 21, Issue 3, Sep. 1998, pp. 506-514.

Li, J. et al. "Controlled Deposition of Individual Single-Walled Carbon Nanotubes on Chemically Functionalized Templates." Chemical Physics Letters, 303, Apr. 2, 1999, pp. 125-129.

McEuen, P.L. et al. "Single-walled Carbon Nanotube Electronics." IEEE Transactions on Nanotechnology, vol. 1, No. 1, Mar. 2002, pp. 78-85.

Meyyappan, M. et al. "Carbon Nanotube Growth by PECVD: a Review." Plasma Sources Science and Technology, vol. 12, Apr. 2, 2003, pp. 205-216.

Ren, Z.F., et al., "Synthesis of Large Arrays of Well-Aligned Carbon Nanotubes on Glass." Science, vol. 282, Nov. 6, 1998, pp. 1105-1107.

Shi, L. "A Microdevice for Measuring Thermophysical Properties of Nanowires and Nanotubes." 2001 ASME International Mechanical Engineering Congress and Exposition, Nov. 11-16, 2001, pp. 359-362.

Shi, L. "Scanning Thermal Microscopy of Carbon Nanotubes Using Batch-Fabricated Probes." Applied Physics Letters, vol. 77, No. 26, Dec. 25, 2000, pp. 4295-4297.

Stevens, R. "Improved Fabrication Approach for Carbon Nanotube Probe Devices." Applied Physics Letters, vol. 77, No. 21, Nov. 20, 2000, pp. 3453-3455.

Sun, X. et al. "Theoretical Modeling of Thermoelectricity in Bi Nanowires." Applied Physics Letters, vol. 74, No. 26, Jun. 28, 1999, pp. 4005-4007.

Tu et al. "Growth of Aligned Carbon Nanotubes with Controlled Site Density." Applied Phys. Letters, American Institute of Physics, May 27, 2002, pp. 4018-4020, vol. 80, No. 21.

Yakobson, B.I. et al. "Fullerene Nanotubes: C1,000,000 and Beyond." American Scientist online, http://www.americanscientist,org/template/AssetDetail/assetid/2870?fulltext=true&print=yes.

Zhang, "Formation of Metal Nanowires on Suspended Single-Walled Carbon Nanotubes." Appl. Phys. Lett., vol. 77(19), p. 3015 (2000.

Zhang, W.D. et al. "Synthesis of Vertically Aligned Carbon Nanotubes Films on Silicon Wafers by Pyrolysis of Ethylenediamine." Elsevier, Thin Solid Films, 422, 2002, pp. 120-125.

Zhang, Y. et al. "Electric-Field-Directed Growth of Aligned single-Walled Carbon Nanotubes." Applied Physics Letters, vol. 79, No. 19, Nov. 5, 2001, pp. 3155-3157.

Zhou, P. et al. "Thermomechanical diagnostics of FLIP-CHIP/BGA Structures Using Phase-Shifting Electronic Speckle Pattern Interferometry." EEP, Advances in Electronic Packaging, vol. 26-2, ASME, 1999, pp. 1875-1880.

* cited by examiner

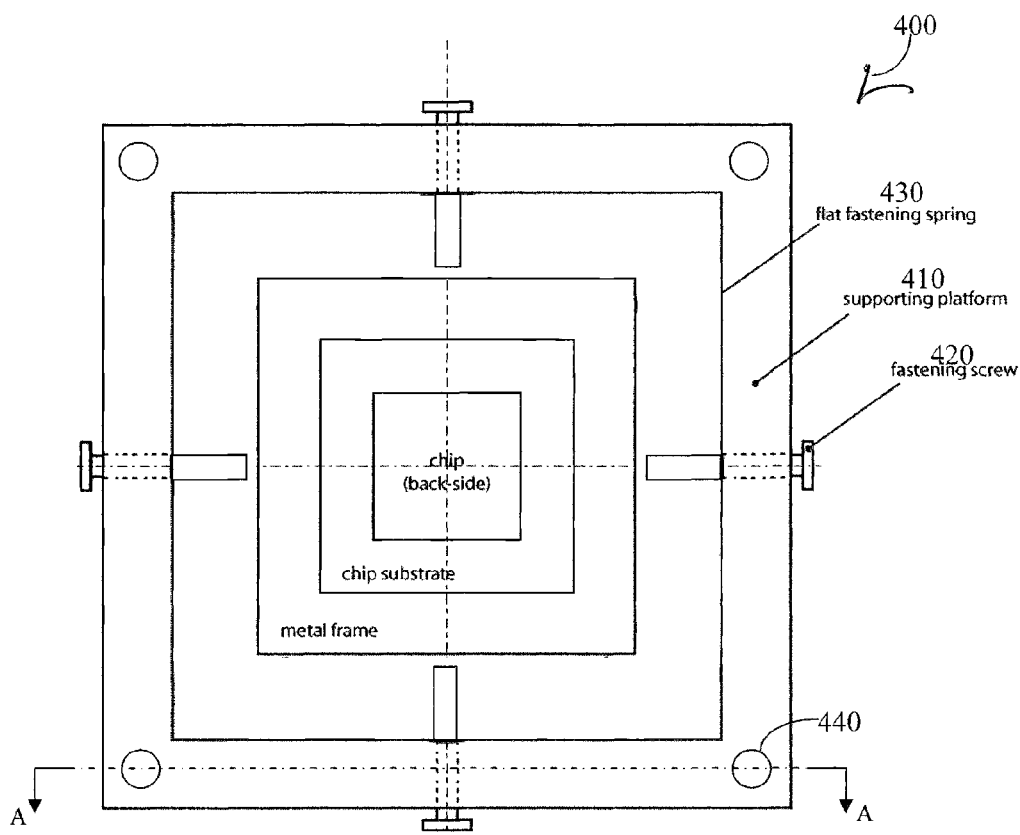
FIG. 4a
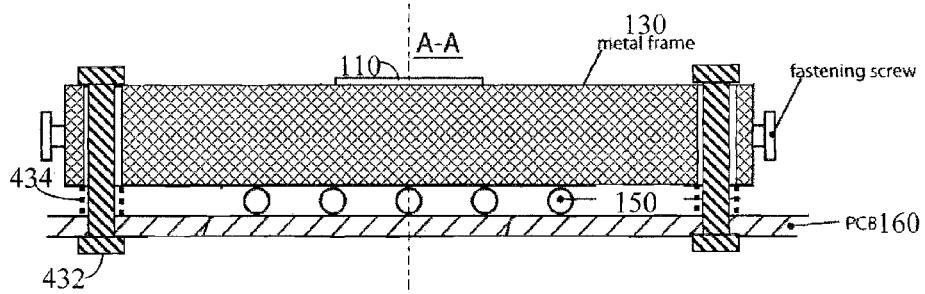
FIG. 4b
FIGURE 4

APPARATUS FOR ATTACHING A COOLING STRUCTURE TO AN INTEGRATED CIRCUIT

CROSS REFERENCE TO RELATED APPLICATIONS

This application claims priority from U.S. provisional patent application Ser. No. 60/663,225, filed on Mar. 21, 2005, the entirety of which is incorporated herein by this reference thereto.

BACKGROUND OF THE INVENTION

1. Technical Field

The invention relates to integrated circuits. More particularly, the invention relates to a method and apparatus for attaching a cooling structure to an integrated circuit.

2. Description of Prior Art

Heat-sink-attachment and thermal-interface-design options are based, on performance considerations, in addition to cost effectiveness. These performance considerations include functional considerations such as thermal properties, and reliability considerations such as mechanical and environmental properties. In addition, the ease and cost of assembly and disassembly of the heat sink (HS) attachment structure are important.

A typical state of the art attachment of a HS or a heat spreader to the backside of a high-power chip physically interconnects the HS structure to the system's substrate structure, namely the printed circuit board (PCB). Such a design approach is used when there is a need to produce a high enough pressure at the thermal interface between the HS and the chip. Such pressure is often needed for a satisfactory thermal performance of the interface.

Also known in the art are attachments of an HS to a package substrate (PS), rather than to the PCB. Designs of this type are not intended and, in many cases, are not even supposed to produce high pressure at the HS/chip interface. Such HS-to-package attachment designs in the current art are acceptable if a relatively low pressure, for example a pressure in the range of 5-20 psi, can ensure a satisfactory thermal management of the integrated circuit (IC) device.

However, it is becoming a more frequent requirement in the industry that a high interfacial pressure of, for example in the range of 70 psi or higher, is needed to produce and control a satisfactory thermal contact. This occurs for example, in the case where a carbon nano-tube (CNT) based HS is used and the tips of the CNTs require high pressure to bend sufficiently and provide the necessary thermal contact. Such a HS is discussed in U.S. patent application Ser. No. 10/925,824, System and Method Using Self-Assembled Nano Structures in the Design and Fabrication of an Integrated Circuit Micro-Cooler, assigned to common assignee and which is herein incorporated by reference thereto for all that it contains. In such case the HS is typically attached to the PCB. This is usually done by using screw-based elements, with or without springs, or flat-spring-based structural elements. This approach can produce a very high pressure at the HS/chip interface providing the necessary pressure to achieve the thermal interface required. However, this approach does suffer from the shortcomings that are discussed below.

As shown in FIGS. 1a and 1b chip 110, connected in a flip-chip (FC) position, is soldered to a package substrate 140 through solder joints 120. A metal frame 130 mounted on top of the substrate 140 further secures the chip 110. The objective of such a reinforcement is to increase the flexural rigidity of the substrate 140 so that it does not bend as a result of the elevated temperature, typically is the range of 220° C. to 280° C. or so, applied to the system during the reflow soldering process. As is known, such a process is an essential part of the technology that is currently used to surface-mount IC packages on PCBs. The solder joints 120 are coupled to ball grid array (BGA) solder joints 150 through the substrate 140, the BGA solder joints 150 being soldered to the PCB 160. The BGA material is typically the most vulnerable part of the BGA package structure. Using prior art solutions, when a screw-based design is used to mount an HS on a package that is further attached to the PCB 160, it is not only the thermal interface that experiences elevated pressure, but also the BGA solder joints 150. This circumstance, favorable from the standpoint of the thermal performance of the device, can have a detrimental effect on the reliability of the BGA solder material, both on a short-term basis because of the excessive static overload, and on a long-term basis because of the significant mechanical loading added. During the system manufacturing, for example, during the reflow soldering process, and operation, for example, power cycling conditions, such a mechanical loading superimposes the thermally induced loading. The thermally induced loading is caused by the change in temperature in the structure in question which is fabricated of dissimilar materials. In addition, temperature gradients are experienced. A significant mechanical pre-stressing may worsen the mechanical performance. That is, the adhesive and/or cohesive strength of the BGA solder material is affected. In some cases, the elevated tensile forces that are applied to the PCB 160 as a result of the mounting of a HS to it can lead to local mechanical, also referred to as physical, damage of the PCB 160 and can result in electrical opens and/or shorts.

Therefore, due to the limitations of prior art solutions, it would be advantageous to provide an HS mounting structure, such that the BGA solder joints and the PCB do not experience the high pressure applied at the thermal HS/chip interface.

SUMMARY OF THE INVENTION

A method and apparatus is provided for attaching a cooling structure to the surface of an integrated circuit (IC). The attachment of the cooling structure, for example a heat sink, to the IC requires that certain pressure is applied, usually by connecting the cooling structure to a Printed Circuit Board (PCB). However, excess pressure may damage the ball grid array (BGA) that connects the IC to the PCB. Attachment of a cooling structure to the IC package substrate is provided without support from the PCB. In one embodiment, shock absorbers are also attached to the cooling structure and the PCB to prevent undesirable vibration of the heat sink mass from affecting the IC.

BRIEF DESCRIPTION OF THE DRAWINGS

FIG. 4 is a plan view (FIG. 4a) and a section view (FIG. 4b) of a third heat sink mounting platform having shock absorbers.

DETAILED DESCRIPTION OF THE INVENTION

Figure 1:
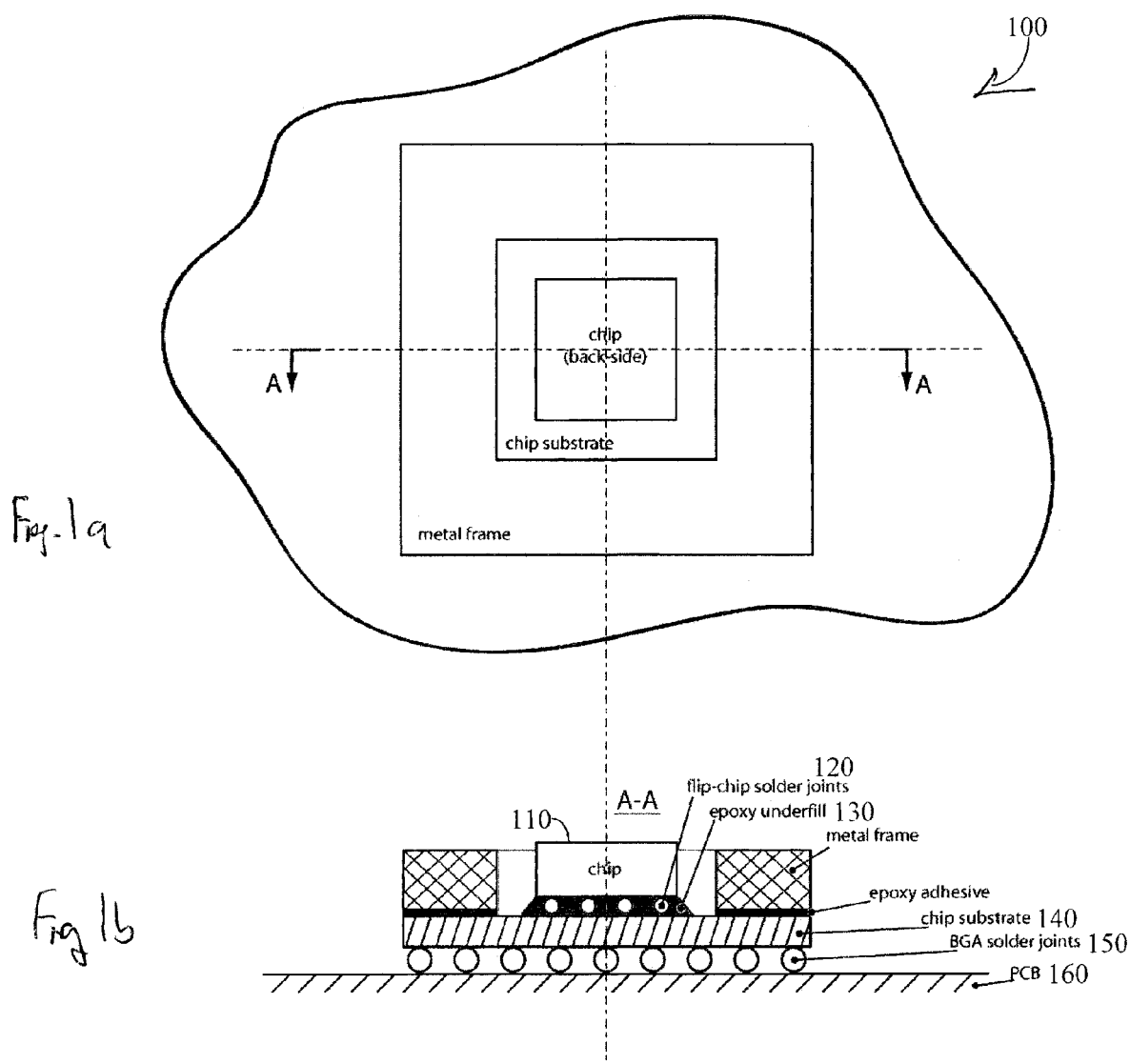
FIG. 1 is a plan view (FIG. 1a) and a section view of (FIG. 1b) of a chip mounted to a PCB (prior art)

The disclosed invention addresses the limitations of the prior art by excluding the ball grid array (BGA) solder joints, for example the BGA solder joints 150 shown in FIG. 1, from exposure to a high axial pressure. Regardless of the actual mounting pressure of a heat sink (HS) to the back side of a chip, for example chip 110, this pressure is not transmitted to the BGA solder joints 150. Specifically, there is disclosed a structural approach that enables the direct attachment of an HS to the package substrate (PS) of a chip, for example PS 140, by using a robust mounting platform (MP). In accordance with an embodiment of the disclosed invention, the MP comprises a piece of hardware that can be two- or three-dimensional and that can be any of several very different designs. A three-dimensional version can be used, for example, for a juxtaposed/multilevel package design. The MP provides sufficient real estate and structural strength so that an HS, or a heat-spreader, can be attached to it. The MP is attached to the PS 140 along PS 140 edges, as disclosed below. Such an attachment is facilitated because the PS is typically reinforced by a metal frame, for example the metal frame 130. The metal frame 130 provides a structural foundation for the successful mounting of the MP. However, if an IC package does not have a metal frame or a PS reinforcement, but the PS is still robust enough to provide a reliable support for the MP, the disclosed invention may be equally applicable.

A typical total thickness of the PS and the metal frame mounted on top of PS is about 2.6 millimeters. This thickness is sufficient to fasten the MP reliably.

FIG. 2a and 2b provide plan (FIG. 2a) and section (FIG. 2b) views where and exemplary and non-limiting schematic 200 of a first heat sink mounting platform (MP) 210 that is screw-based. The MP 210 is a frame that encompasses an IC from its sides. On at least two opposite sides of the MP 210 there are fastening screws 220 designed to fasten the MP 210 to the PS 140 and/or the metal frame 130. Fastening screws 220 may directly connect to the PS 140 and/or the metal frame 130. However, springs such as spring element 230, may be used as well as other elements to enable such attachment. In other embodiments of the disclosed invention, a flat spring (not shown), clamp (not shown), clip (not shown) or other fastening element may be used to secure the attachment of the MP 210 to the PS 140 and/or metal frame 130. The fastening elements, regardless of type or structure, withstand a very high in-plane load before buckling or otherwise failing. The MP 210 provides ample real-estate to support an HS (not shown) and to apply the desired pressure to the back of the chip 110, without the pressure being transferred to the BGA solder joints 150.

Similarly, a flat-spring-based attachment (FSA) 300 is shown in FIGS. 3a and 3b, the principle of operation is similar to those discussed with respect to FIGS. 2a and 2b and therefore, not repeated here. An MP attached directly to a PS, is further capable of relieving the BGA solder joints. For example, the BGA solder joints 150, and/or the PCB are relieved from excess loading. In this embodiment, the fastening screws may be equipped with a torque limiter that limits the amount of pressure a fastening screw applies to a spring, or directly to the PS and/or metal frame.

Figure 2:
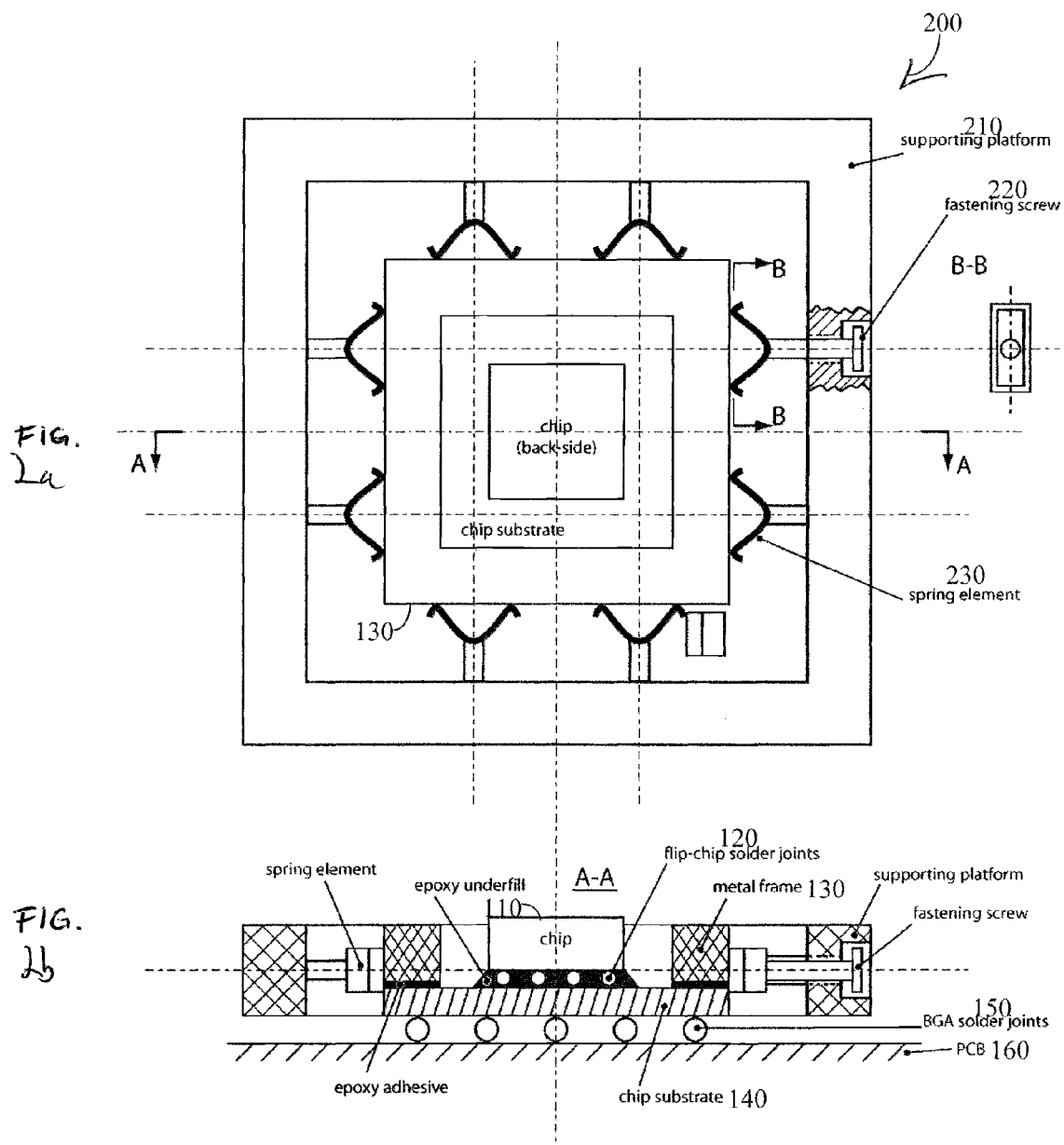
FIG. 2 is a plan view (FIG. 2a) and a section view (FIG. 2b) of a first heat sink mounting platform in accordance with the disclosed invention.
Figure 3:
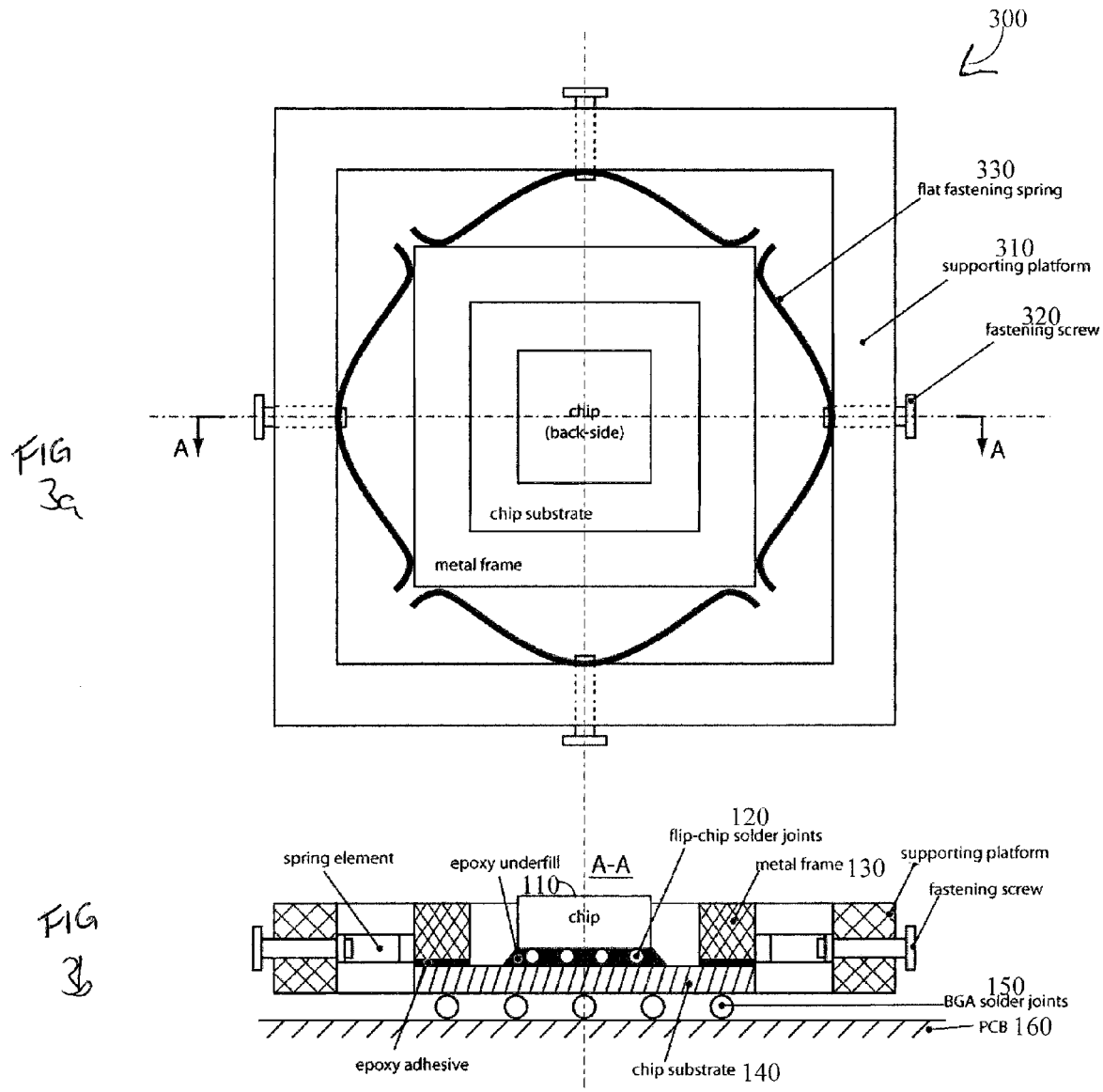
FIG. 3 is a plan view (FIG. 3a) and a section view (FIG. 3b) of a second heat sink mounting platform in accordance with the disclosed invention.

The curvilinear end-spring-elements (ESEs) elongated in the direction of the package edge, are attached to the screws at their tips, for example as shown in FIG. 2, provide good mechanical contact on the surface of the elements. These contacts can be reinforced, if necessary, by thin strips of a soft metal or by a metal type Velcro®, to maximize the friction at the interface between the ESEs and the PS, and/or the metal frame. The adhesion forces are due to the reaction of the stiff and robust frame structure of the MP to the elongation of the screws during MP mounting and the resulting deformation of the ESEs.

In the embodiment shown in FIGS. 3a and 3b, the reaction force is provided initially by the curved springs 330. The springs may be manufactured from initially flat spring-metal strips. The required spring design is predetermined by an appropriate calculation, for example by predictive modeling, aimed at the evaluation of the forces that such a spring imposes on the structure after it is deployed during the mounting process. The edges of the flat springs can be preliminarily bonded, or otherwise attached, to the MP, and released during the mounting process, after the frame is put onto the package structure. For instance, a low temperature melting solder, for example Indium based, can be used to bond the ends of the flat springs to the MP frame, and can then be released by heating up the system after the FSP frame is put onto the package frame. Another option is to use strings that are cut off after the FSP frame is put onto the package frame.

FIGS. 4a and 4b provide plan (FIG. 4a) and section (FIG. 4b) views 400 of a third heat sink mounting platform having a shock absorber. The HS (not shown) is a mass placed over the chip and may be susceptible to the impact of a variety of forces. These forces may result in vibrations amplified by the HS mass and may potentially cause damage to the BGA solder joints 150. Therefore, in one embodiment of the disclosed invention the shock absorbers 432, having for example springs 434, mount the MP 410 to the PCB 160. The MP structures disclosed in FIG. 2 or 3 may be used to affix the MP to the PS or the metal frame. The MP 410 is modified by having the necessary hooks, for example protruding holes 440 to enable the attachment of the shock absorber 432. Vibrations are restrained through the operation of the shock absorber mechanism thereby preventing damage to BGA solder joints 150.

The invention disclosed herein provide various advantages over prior art solutions, that include, but are not limited to the examples set forth below. A successful attachment of the HS to the PS and/or the metal frame can be achieved without any change in the existing package structure. The ability to mount, remove, and replace the HS without damaging the package, the HS itself, or the PCB are important considerations in HS design and mounting technology, and these considerations are addressed in the invention disclosed herein. The MP is a mechanical attachment and hence is easy to install, repair, and use. Furthermore, no epoxies or other chemicals are used which shortens the production time and overcomes ergonomic problems. The thermal performance achieved using the disclosed MP is superior to prior art solution because significant pressure can be applied to mount the HS on top the chip 110 without harming the integrity of the BGA solder joints. Furthermore, the disclosed invention can be used regardless of whether an additional interface material, for example, thermal grease or phase changing material, is or is not used for improved thermal performance of the HS-to-chip interface.

Although the invention is described herein with reference to preferred embodiments, one skilled in the art will readily appreciate that other applications may be substituted for those set forth herein without departing from the spirit and scope of the present invention. Specifically, the particular mounting of the MP to the PS can be achieved by using a screw-based approach/platform (SBP) and a flat-spring-based (FSP) approach, Velcro-type attachment, and others, all to be considered to be within the framework of the disclosed invention.

Furthermore, while fastening screws are shown to be opposite each other, embodiments designed to provide a balanced force holding the MP in place are also envisioned and are specifically included within the spirit of the disclosed invention.

Accordingly, the invention should only be limited by the Claims included below.

The invention claimed is:

1. Apparatus for supporting attachment of a mass to an integrated circuit (IC) which in turn, is mounted on top of a printed circuit board (PCB) and which is coupled thereto via a plurality of solder joints comprising:
   a frame having inner dimensions to allow for the placement of said frame around the IC; and
   a plurality of fasteners protruding from said frame at each of said frame sides;
   wherein said fasteners are adjustable to fasten said frame to said IC without support from said PCB, said fasteners applying a pressure sufficient to attach a mass attached to said IC, without transferring pressure to said solder joints that couple said IC to said PCB.

2. The apparatus of claim 1, further comprising:
   a spring element attached at an edge of said fastener.

3. The apparatus of claim 2, future comprising:
   a coating at the edges of said spring element that are in contact with the IC package, said coating to enhancing the friction between said spring element and said IC package.

4. The apparatus of claim 1, wherein the pressure applied to said mass is greater than 50 pounds per square inch.

5. The apparatus of claim 1, said solder joints comprising ball grid array (BGA) solder joints.

6. The apparatus of claim 1, said mass comprising any of a heat sink and a heat spreader.

7. The apparatus of claim 6, said heat sink is comprising:
   carbon nano-tubes having edges that are pressed to said IC to establish thermal conductivity therefrom.

8. The apparatus of claim 1, said IC comprising a high-power IC.

9. The apparatus of claim 1, each of said plurality of fasteners having a corresponding fastener of said plurality of fastener positioned in a substantially opposite direction therefrom.

10. The apparatus of claim 1, said fasteners further comprising torque limiters.

11. The apparatus of claim 1, further comprising:
   a plurality of shock absorbers coupled between said frame and said PCB.

12. Apparatus for supporting attachment of a mass to an integrated circuit (IC) which in turn, is mounted on top of a printed circuit board (PCB), and which is coupled thereto comprising:
   a frame having inner dimensions to allow for the placement of said frame around said IC; and
   a plurality of fasteners protruding from each side of said frame, an edge of each fastener being attached to at least one flat fastening spring;
   wherein when said flat fastening spring is released they serve to fasten said frame to said IC without support from said PCB, and apply a pressure that is sufficient to attach a mass to said IC without said pressure to solder joints that couple said IC to said PCB.

13. The apparatus of claim 12, further comprising:
   bonding points on an inner portion of said frame for the edges of said flat fastening spring.

14. The apparatus of claim 13, said bonding points comprising low-melting point temperature material.

15. The apparatus of claim 14, said low-melting point material comprising Indium.

16. The apparatus of claim 12, further comprising:
   a coating on the edges of said flat fastening spring that are in contact with said IC package, said coating enhancing friction between said spring element and said IC package.

17. The apparatus of claim 12, wherein the pressure applied to said mass is greater than 50 pounds per square inch.

18. The apparatus of claim 12, said solder joints comprising ball grid array (BGA) solder joints.

19. The apparatus of claim 12, said mass comprising any of a heat sink and a heat spreader.

20. The apparatus of claim 19, said heat sink comprising carbon nano-tubes the edges of which are pressured to the IC for the purpose of achieving the desired thermal conductivity.

21. The apparatus of claim 12, said IC comprising a high-power IC.

22. The apparatus of claim 12, each of said plurality of having a corresponding fastener of said plurality of fastener positioned in a substantially the opposite direction therefrom.

23. The apparatus of claim 12, further comprising:
   a plurality of shock absorbers coupled between said frame and said PCB.

* * * * *

UNITED STATES PATENT AND TRADEMARK OFFICE
CERTIFICATE OF CORRECTION

PATENT NO. : 7,477,527 B2 Page 1 of 1
APPLICATION NO. : 11/386254
DATED : January 13, 2009
INVENTOR(S) : Ephraim Suhir It is certified that error appears in the above-identified patent and that said Letters Patent is hereby corrected as shown below:

In column 5, line 24, delete "future" and insert -- further --.

Signed and Sealed this

Twenty-fourth Day of February, 2009

JOHN DOLL
*Acting Director of the United States Patent and Trademark Office*